(12) United States Patent
Ohno et al.

(10) Patent No.: US 9,860,638 B2
(45) Date of Patent: Jan. 2, 2018

(54) ACOUSTIC DEVICE, ACOUSTIC SYSTEM, MOVING BODY DEVICE, AND MALFUNCTION DIAGNOSIS METHOD FOR ACOUSTIC SYSTEM

(71) Applicant: Panasonic Intellectual Property Management Co., Ltd., Osaka (JP)

(72) Inventors: Ichiro Ohno, Osaka (JP); Fumiyasu Konno, Osaka (JP); Shinnosuke Nagasawa, Osaka (JP); Shigeharu Sumi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/916,346

(22) PCT Filed: Sep. 11, 2014

(86) PCT No.: PCT/JP2014/004688
§ 371 (c)(1),
(2) Date: Mar. 3, 2016

(87) PCT Pub. No.: WO2015/040836
PCT Pub. Date: Mar. 26, 2015

(65) Prior Publication Data
US 2016/0198259 A1    Jul. 7, 2016

(30) Foreign Application Priority Data

Sep. 20, 2013  (JP) .................................. 2013-194914

(51) Int. Cl.
*H04R 3/00*     (2006.01)
*H04R 29/00*    (2006.01)
(Continued)

(52) U.S. Cl.
CPC ................. *H04R 3/007* (2013.01); *B60L 3/00* (2013.01); *B60Q 5/008* (2013.01); *B60Q 11/00* (2013.01);
(Continued)

(58) Field of Classification Search
CPC .. H04R 3/007; H04R 29/001; H04R 2420/03; B60L 3/00; B60Q 5/008; B60Q 11/00; G01R 31/007; G01R 31/025
See application file for complete search history.

(56) References Cited

U.S. PATENT DOCUMENTS 4,881,058 A   11/1989  Berry, III
5,345,510 A    9/1994  Singhi et al.
(Continued)

FOREIGN PATENT DOCUMENTS

CN    101264755 A    9/2008
CN    101380927 A    3/2009
(Continued)

OTHER PUBLICATIONS

International Search Report of PCT application No. PCT/JP2014/004688 dated Dec. 16, 2014.
(Continued)

*Primary Examiner* — Sonia Gay
(74) *Attorney, Agent, or Firm* — McDermott Will & Emery LLP

(57) ABSTRACT

An inspection signal generator of an acoustic device outputs a first inspection signal. An amplifier receives a first reference signal, and outputs a second inspection signal according to the first inspection signal. A first detector is electrically connected to an output side of the amplifier, and outputs a first detection signal based on the second inspection signal. The first detector is electrically connected to the output side of the amplifier, and outputs the first detection
(Continued)

signal based on the second inspection signal. A determiner compares a first detection signal output from the first detector with a preset determination reference signal so as to detect electrical abnormality between a ground terminal and an output terminal electrically connected to the output side of the amplifier.

24 Claims, 8 Drawing Sheets

(51) Int. Cl.
    *B60Q 5/00*      (2006.01)
    *B60Q 11/00*     (2006.01)
    *B60L 3/00*      (2006.01)
    *G01R 3/00*      (2006.01)
    *G01R 31/00*     (2006.01)
    *G01R 31/02*     (2006.01)
    *G01R 31/28*     (2006.01)

(52) U.S. Cl.
    CPC ......... *H04R 29/001* (2013.01); *G01R 31/007* (2013.01); *G01R 31/025* (2013.01); *G01R 31/2825* (2013.01); *H04R 2420/03* (2013.01)

(56) References Cited

U.S. PATENT DOCUMENTS

| | | | |
|---|---|---|---|
| 6,137,044 A | 10/2000 | Guilmette et al. | |
| 6,603,392 B1 | 8/2003 | Ramm | |
| 7,764,800 B2 | 7/2010 | Maeda | |
| 8,204,243 B2 | 6/2012 | Smith | |
| 2002/0024396 A1 | 2/2002 | Yamashita et al. | |
| 2004/0170288 A1* | 9/2004 | Maeda | H04R 5/04 381/86 |
| 2005/0283839 A1 | 12/2005 | Cowburn | |
| 2006/0052957 A1* | 3/2006 | Hidehira | G01R 31/2806 702/58 |
| 2007/0153780 A1* | 7/2007 | Stanley | G01R 31/007 370/360 |
| 2008/0187166 A1* | 8/2008 | Ko | H04R 5/023 381/388 |
| 2008/0215240 A1 | 9/2008 | Howard et al. | |
| 2009/0003619 A1 | 1/2009 | Solow | |
| 2009/0080672 A1* | 3/2009 | Smith | B60Q 5/008 381/86 |
| 2010/0095030 A1 | 4/2010 | Chiu | |
| 2011/0095817 A1 | 4/2011 | Yamada | |
| 2012/0092185 A1 | 4/2012 | Hayashi et al. | |
| 2013/0070933 A1 | 3/2013 | Itou | |
| 2013/0314836 A1 | 11/2013 | Christie | |
| 2014/0300455 A1 | 10/2014 | Tsuzuki et al. | |

FOREIGN PATENT DOCUMENTS

| | | |
|---|---|---|
| CN | 102452354 A | 5/2012 |
| EP | 794604 A2 | 9/1997 |
| EP | 2229006 A1 | 9/2010 |
| JP | H06-088870 | 3/1994 |
| JP | 3010357 B1 | 2/2000 |
| JP | 2000-175299 A | 6/2000 |
| JP | 2003-070098 A | 3/2003 |
| JP | 2004-136831 | 5/2004 |
| JP | 2008-085476 A | 4/2008 |
| JP | 2008-244554 A | 10/2008 |
| JP | 2011-031865 | 2/2011 |
| JP | 2011-031865 A | 2/2011 |
| JP | 2011-091642 A | 5/2011 |
| JP | 2012-056400 A | 3/2012 |
| JP | 2013-028232 | 2/2013 |
| WO | 2009/087772 A1 | 7/2009 |
| WO | 2013/118250 | 8/2013 |

OTHER PUBLICATIONS

The Extended European Search Report dated Sep. 21, 2016 for the related European Patent Application No. 14845060.4.
English Translation of Chinese Search Report dated Apr. 1, 2017 for the related Chinese Patent Application No. 201480051051.5.
English translation of Chinese Search Report dated Feb. 29, 2016, for the related Chinese Patent Application No. 201380035371.7.
International Search Report issued in PCT/JP2013/004128, dated Oct. 8, 2013, with English translation.
The Extended European Search Report dated Feb. 1, 2016 for the related European Patent Application No. 13812650.3.
U.S. Office Action issued in U.S. Appl. No. 14/404,910 dated Mar. 1, 2017.
U.S. Final Office Action issued in U.S. Appl. No. 14/404,910 dated Oct. 14, 2016.
U.S. Office Action issued in U.S. Appl. No. 14/404,910 dated May 2, 2016.

\* cited by examiner

ACOUSTIC DEVICE, ACOUSTIC SYSTEM, MOVING BODY DEVICE, AND MALFUNCTION DIAGNOSIS METHOD FOR ACOUSTIC SYSTEM

TECHNICAL FIELD

The present invention relates to an acoustic device that outputs a sound indicating movement of a moving body device to an outside of or a space in the moving body device in a state where the moving body device moves. The present invention also relates to an acoustic system, and the moving body device, and a malfunction diagnosis method for the acoustic system.

BACKGROUND ART

FIG. 13 is a conceptual diagram illustrating conventional moving body device 7. Acoustic device 6 includes controller 1, amplifier 2, and capacitor 3. Speaker 4 is electrically connected to an output side of acoustic device 6. Acoustic device 6 is mounted to moving body device 7.

Upon receiving a vehicle signal, controller 1 outputs an audio signal. Amplifier 2 amplifies the audio signal. An output from amplifier 2 is supplied to speaker 4 via capacitor 3. Capacitor 3 cuts a direct-current (DC) voltage in the output from amplifier 2. In the above configuration, acoustic device 6 starts to output sound 8 from speaker 4, based on the vehicle signal, at substantially the same time when moving body device 7 starts to move.

Patent Literature 1, for example, is known as citation relating to the invention of this application.

CITATION LIST

Patent Literature

PTL 1: Unexamined Japanese Patent Publication No. 2011-31865

SUMMARY OF THE INVENTION

An acoustic device of the present invention includes an inspection signal generator, an amplifier, an output terminal, a ground terminal, a first detector, and a determiner. The inspection signal generator outputs a first inspection signal. The amplifier receives the first inspection signal and outputs a second inspection signal according to the first inspection signal. The first detector is electrically connected to an output side of the amplifier, and outputs a first detection signal based on the second inspection signal. The output terminal is electrically connected to the output side of the amplifier. The ground terminal is electrically connected to a ground. The first detector is electrically connected to the output side of the amplifier, and outputs the first detection signal based on the second inspection signal. The determiner compares the first detection signal output from the first detector with a preset determination reference signal so as to detect electrical abnormality between the output terminal and the ground terminal.

Further, a malfunction diagnosis method for an acoustic system of the present invention includes generating a first inspection signal, outputting the first inspection signal or an audio signal according to input of a first reference signal, amplifying the first inspection signal or the audio signal, outputting a first detection signal based on a second inspection signal obtained by amplifying the first inspection signal, and comparing the first detection signal with a preset determination reference signal.

In the above configuration, the determiner can detect a malfunction of the acoustic system according to the second inspection signal based on the first inspection signal generated by the inspection signal generator in a state where a speaker is connected between the output terminal and the ground terminal. Therefore, the determiner can detect the malfunction of the acoustic system without using an audio signal. As a result, the acoustic device can quickly detect the malfunction of the acoustic system.

DESCRIPTION OF EMBODIMENT

Prior to description about an exemplary embodiment of the present invention, a problem in a conventional acoustic device is described.

Figure 13:
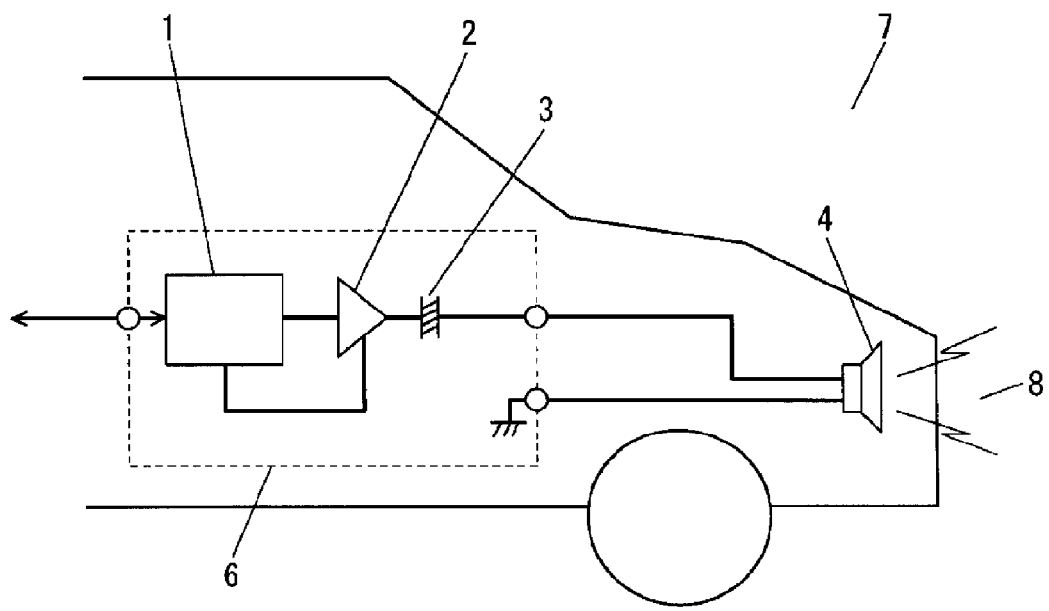
FIG. 13 is a block diagram of a conventional acoustic device.

When acoustic device 6 illustrated in FIG. 13 is opened, any audio signal is not transmitted to speaker 4. The open state of acoustic device 6 means a state where a circuit is opened. For example, a state where an electric cord for connecting acoustic device 6 to speaker 4 or a wire inside speaker 4 is disconnected meets definition of the open state of acoustic device 6.

On the other hand, when a short circuit occurs between acoustic device 6 and power supply +B, acoustic device 6 is connected to another power supply line at low resistance. For this reason, an overcurrent flows in acoustic device 6, and thus acoustic device 6 occasionally breaks down. As a result, an audio signal is not output from acoustic device 6. The short-circuit with respect to +B means a state where a voltage of another power supply line is applied to acoustic device 6. For example, a case where the cord connecting acoustic device 6 with speaker 4 is shorted-circuited with respect to a cord connected to a power supply such as a battery meets definition of the state of the short-circuit with respect to +B.

When an operator (a driver) confirms that a sound is not output from speaker 4 after moving body device 7 actually starts to run, the operator can detect a malfunction of acoustic device 6.

However, acoustic device 6 cannot detect malfunctions such as the open state and the short-circuit with respect to +B. The operator, therefore, cannot check a malfunction of acoustic device 6 before moving body device 7 moves.

The following describes an acoustic device for being mounted to a moving body device, according to an exemplary embodiment of the present invention, that can quickly diagnose a malfunction of the acoustic device.

Figure 1:
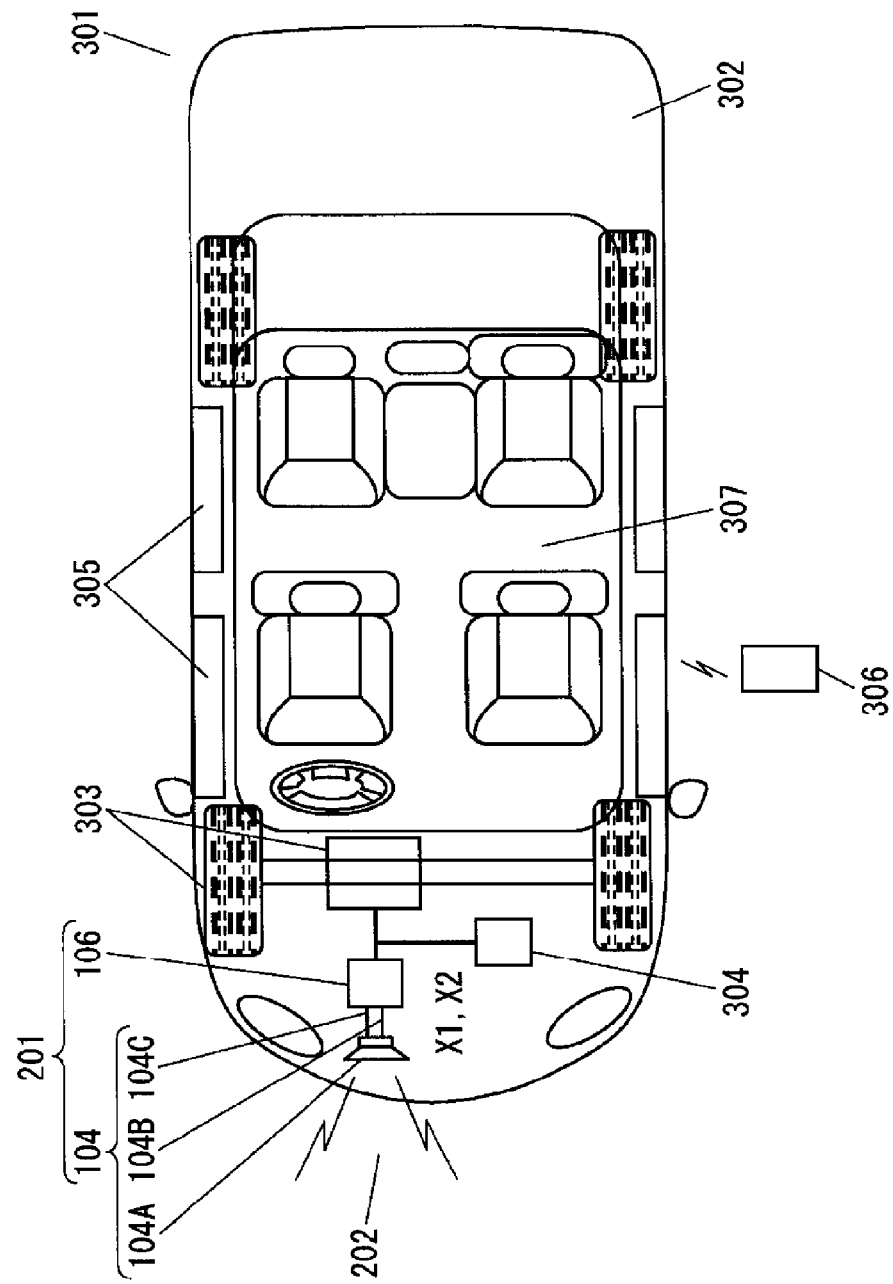
FIG. 1 is a conceptual diagram of a moving body device according to an exemplary embodiment of the present invention.

FIG. 1 is a conceptual diagram of moving body device 301 mounted with acoustic device 106 according to an exemplary embodiment of the present invention. Acoustic device 106 is mounted to moving body device 301. Moving body device 301 includes main body 302 containing space 307, driver 303, drive controller 304, and acoustic system 201. Moving body device 301 may further include door 305 and portable device 306. Portable device 306 outputs a signal that indicates locking and unlocking of door 305 on a position separated from moving body device 301. Driver 303, drive controller 304, and acoustic system 201 are mounted to main body 302.

Moving body device 301 has space 307 inside main body 302. A person who operates (drives) moving body device 301, for example, boards space 307.

Drive controller 304 is electrically connected with driver 303 and acoustic system 201. Drive controller 304 outputs reference signals to respective units of moving body device 301 including driver 303 and acoustic system 201. As a result, driver 303 is controlled by the reference signal. Driver 303 includes a motor. Driver 303 may further include an engine and tires. That is to say, examples of moving body device 301 include an electric vehicle and a hybrid vehicle.

Acoustic system 201 includes acoustic device 106 and first sound output unit 104. First sound output unit 104 is a transducer, and converts a signal output from acoustic device 106 into sound 202 so as to output sound 202 to an outside of moving body device 301. First sound output unit 104 may output sound 202 to space 307. Alternatively, first sound output unit 104 may output sound 202 to both the outside of moving body device 301 and space 307.

For example, first sound output unit 104 may include first speaker 104A, first connecting wire 104B, and second connecting wire 104C. First connecting wire 104B and second connecting wire 104C electrically connect acoustic device 106 and first speaker 104A. For example, first connecting wire 104B is a signal wire, and second connecting wire 104C is a ground wire.

In the case where first speaker 104A outputs sound 202 to the outside of moving body device 301, first speaker 104A is preferably installed on main body 302 so as to be capable of emitting a sound to the outside of moving body device 301. In this configuration, acoustic system 201 can notify a person of approach of moving body device 301 through sound 202. In the case where moving body device 301 runs only by the motor, acoustic system 201 preferably generates sound 202. Examples of the "person" in this case may include a rider of a bicycle or a motorbike, an operator (driver) of another moving body device 301, and a foot passenger (walkers). Further, sound 202 to be output from acoustic system 201 is preferably a pseudo engine noise, for example. As a result, the person can notice the approach of moving body device 301 without visually recognizing moving body device 301.

First speaker 104A is preferably mounted to main body 302 so as to be capable of emitting a sound to space 307 in the case where first speaker 104A outputs sound 202 to space 307 inside moving body device 301. This configuration enables the person who boards moving body device 301 to hear a realistic sound.

Acoustic device 106 preferably includes a connector that is to be connected to first connecting wire 104B and/or second connecting wire 104C with acoustic device 106. In this case, one end of first connecting wire 104B and one end of second connecting wire 104C include connectors for connection with acoustic device 106. Further, first speaker 104A preferably includes a connector for connection with first connecting wire 104B and/or second connecting wire 104C. In this case, the other end of first connecting wire 104B and the other end of second connecting wire 104C include connects for connection with first speaker 104A.

Figure 2:
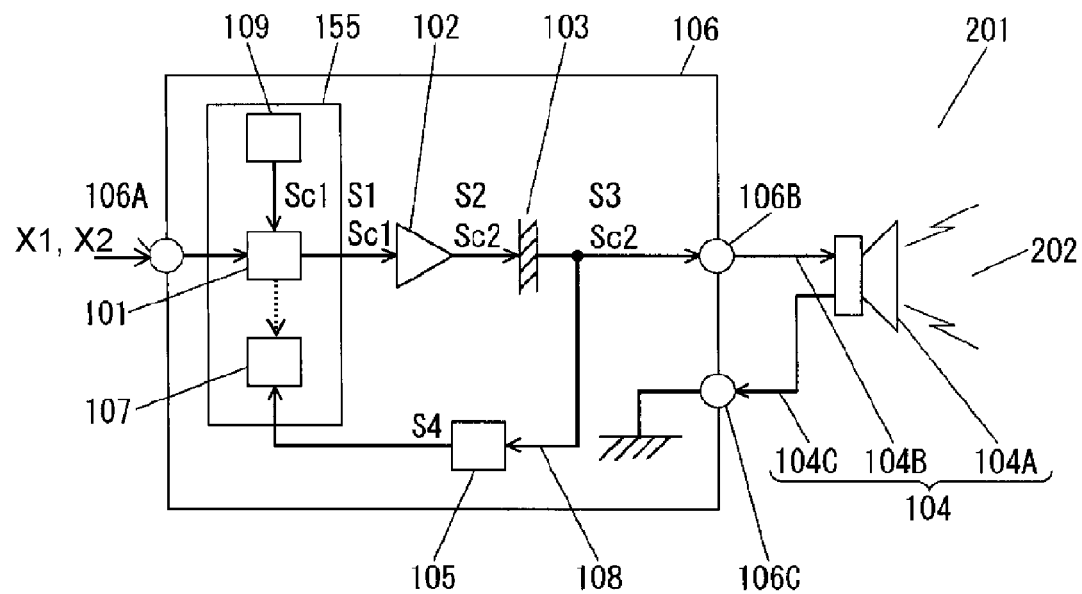
FIG. 2 is a block diagram of an acoustic system according to the exemplary embodiment of the present invention.

FIG. 2 is a block diagram of acoustic system 201 including acoustic device 106 according to the exemplary embodiment of the present invention. Acoustic device 106 includes input terminal 106A, output terminal 106B, ground terminal 106C, controller 101, amplifier 102, capacitor 103, first detector 105, determiner 107, and inspection signal generator 109. Inspection signal generator 109 generates first inspection signal Sc1. Controller 101 receives a reference signal input from input terminal 106A. Controller 101 outputs one of audio signal S1 and first inspection signal Sc1 to amplifier 102 according to the received reference signal. When the received reference signal is second reference signal X2, controller 101 outputs audio signal S1. When the received reference signal is first reference signal X1 that is input before second reference signal X2, controller 101 outputs first inspection signal Sc1. In this configuration, controller 101 does not simultaneously output first inspection signal Sc1 and audio signal S1. That is to say, controller 101 outputs first inspection signal Sc1 to amplifier 102, and then outputs audio signal S1.

Note that inspection signal generator 109 may receive the reference signal and generate first inspection signal Sc1 according to the received reference signal. Alternatively, first inspection signal Sc1 generated by inspection signal generator 109 may be supplied directly to amplifier 102 without via controller 101.

Amplifier 102 is electrically connected to an output side of controller 101. Amplifier 102 amplifies one of audio signal S1 and first inspection signal Sc1. When audio signal S1 is input, amplifier 102 amplifies audio signal S1 and outputs audio signal S2. When first inspection signal Sc1 is input, amplifier 102 amplifies first inspection signal Sc1 and outputs second inspection signal Sc2. Output terminal 106B is electrically connected to an output side of amplifier 102. Ground terminal 106C is electrically connected to a ground.

Further, capacitor 103 is preferably connected between the output side of amplifier 102 and output terminal 106B in series. Audio signal S2 includes audio signal S3 that is an alternating-current (AC) component, and a DC signal component. Further, second inspection signal Sc2 is an alternating signal. Therefore, audio signal S3 and second inspection signal Sc2 can pass through capacitor 103. Capacitor 103 prevents the DC signal component from being output to first speaker 104A.

First sound output unit 104 is electrically connected between output terminal 106B and ground terminal 106C. As a result, first sound output unit 104 receives audio signal S3 and second inspection signal Sc2 output from acoustic device 106. First sound output unit 104 converts audio signal S3 and second inspection signal Sc2 into sound 202 so as to output sound 202.

First detector 105 is electrically connected to the output side of amplifier 102. First detector 105 is preferably connected between capacitor 103 and output terminal 106B. An input terminal of first detector 105 may be connected a portion between capacitor 103 and amplifier 102. First detector 105 outputs first detection signal S4 based on an output signal from amplifier 102. In this case, second inspection signal Sc2 is input into first detector 105. Then, first detector 105 detects second inspection signal Sc2 and outputs first detection signal S4 according to second inspection signal Sc2. Determiner 107 is electrically connected to an output side of first detector 105. Then, determiner 107 compares first detection signal S4 with a determination reference signal.

In the above configuration, acoustic device 106 can diagnose a malfunction of acoustic system 201 according to first inspection signal Sc1 that is generated by inspection signal generator 109 based on first reference signal X1. That is to say, acoustic device 106 can diagnose a malfunction of acoustic system 201 without using audio signal S3. Therefore, acoustic device 106 can diagnose a malfunction of acoustic system 201 without waiting for second reference signal X2 that is input after first reference signal X1. As a result, acoustic device 106 can quickly complete the diagnosis of a malfunction in acoustic system 201. For example, acoustic device 106 can diagnose a state where a signal wire is open (disconnected) on a line from amplifier 102 to the ground, a state of a short-circuit with respect to another power supply line (+B), and a state of a short-circuit with respect to the ground.

In recent years, moving body devices such as electric vehicles and hybrid vehicles have been developed and been commercially available for environmental conservation. When the moving body devices such as electric vehicles and hybrid vehicles run only by motors, the moving body devices generate only sound of rotating motors. The sound of rotating motors, however, is extremely small as compared with sound of driving engines. Therefore, when acoustic device 6 illustrated in FIG. 13 breaks down, the person hardly recognizes the approach of moving body device 7. Further, when acoustic device 6 generates sound 8 only to the outside of moving body device 7, the operator inside moving body device 7 hardly recognizes sound 8. Therefore, the operator is likely to operate moving body device 7 without recognizing that sound 8 is not output due to a malfunction of acoustic device 6. As a result, the person is late in noticing the approach of moving body device 7, and a minor collision between moving body device 7 and the person or another moving body device 7 is likely to occur. Further, the person is likely to be surprised by approach of moving body device 7 without noticing in advance and fall.

On the other hand, acoustic device 106 illustrated in FIG. 1 can quickly notify an operator who operates moving body device 301 of a diagnosis result in acoustic device 106. Therefore, the operator can quickly notice a malfunction of acoustic system 201. Preferably, acoustic device 106 diagnoses a malfunction of acoustic device 106 before moving body device 301 starts to move. This configuration improves safety of moving body device 301 mounted with acoustic system 201. Further, even when acoustic system 201 outputs sound 202 only to the outside of moving body device 301, the operator can easily notice a malfunction of acoustic system 201.

A configuration and an operation of acoustic device 106 are further described in detail hereinafter with reference to the drawings. A configuration of controller 101 is described first with reference to FIG. 2. Sound source data that is a source of audio signal S1 is stored in controller 101. The sound source data is a digital signal. The sound source data may be artificially generated by executing a digital process on sound 202 similar to an engine noise, for example. Alternatively, actual engine noises are collected, and collected engine noises may be converted into a digital signal so that the sound source data may be generated. Controller 101 converts the sound source data into an analog signal based on a reference signal so as to generate audio signal S1. As a result, controller 101 can output audio signal S1 to amplifier 102.

The sound source data is preferably compressed by a prescribed method and is stored. As a result, storage capacity of controller 101 can be small. In this case, controller 101 restores the sound source data, and converts the sound source data into an analog signal.

In such a manner, when detecting second reference signal X2, controller 101 outputs audio signal S1. Second reference signal X2 is preferably a reference signal that enables start of movement of moving body device 301 illustrated in FIG. 1 to be detected. For example, a signal indicating a step-in angle of an accelerator pedal, a signal indicating a running state, or a signal indicating a moving speed of moving body device 301 can be used as second reference signal X2.

Second reference signal X2 is not limited to the above examples. Second reference signal X2 may be a reference signal to be output from drive controller 304 illustrated in FIG. 1 before the operator moves moving body device 301. For example, second reference signal X2 may be an ignition signal (a signal for starting the motor), a signal indicating that a foot brake is released, a signal indicating that a parking brake is released, a signal indicating that a shift lever is in a drive position, or a signal for controlling the rotation of the motor. Further, second reference signal X2 may be a signal that is not directly generated by drive controller 304.

Further, second reference signal X2 may be a signal that is any one of these signals. Further, second reference signal X2 is not limited to one of them, and may include a plurality of the above signals. In this case, when controller 101 detects that any one of these reference signals is second reference signal X2, controller 101 outputs audio signal S1. Alternatively, when controller 101 detects a plurality of predetermined second reference signals X2, controller 101 may output audio signal S1.

Further, second reference signal X2 may be any one of these signals. Alternatively, second reference signal X2 may include two or more of these signals. In this case, when controller 101 detects any of second reference signals X2, controller 101 outputs audio signal S1.

On the other hand, first reference signal X1 is, for example, a signal for unlocking door 305, or a signal indicating that door 305 is opened. Further, first reference signal X1 may be a signal that is not directly generated by drive controller 304. First reference signal X1, is, for example, a signal for demanding the unlocking of door 305 from portable device 306. Further, first reference signal X1 may be a signal for the operator to try to move the moving body device. For example, first reference signal X1 may be an ignition signal (a signal for starting the motor), a signal indicating that a foot brake is released, a signal indicating that a parking brake is released, a signal indicating that a shift lever is in a drive position, or a signal for controlling the rotation of the motor. In this case, second reference signal X2 is a signal indicating that the movement of moving body device 301 is actually started.

Note that, the reference signal may be any one of these signals. Further, the reference signal is not limited to one signal, and may include a plurality of the above signals.

In this configuration, controller 101 can detect that the movement of moving body device 301 has been started or will be started shortly based on second reference signal X2. When controller 101 detects that the movement of moving body device 301 has been started or will be started shortly, controller 101 outputs audio signal S1. As a result, acoustic system 201 can start to output sound 202 at substantially the same time when moving body device 301 illustrated in FIG. 1 starts to run.

Figure 3:
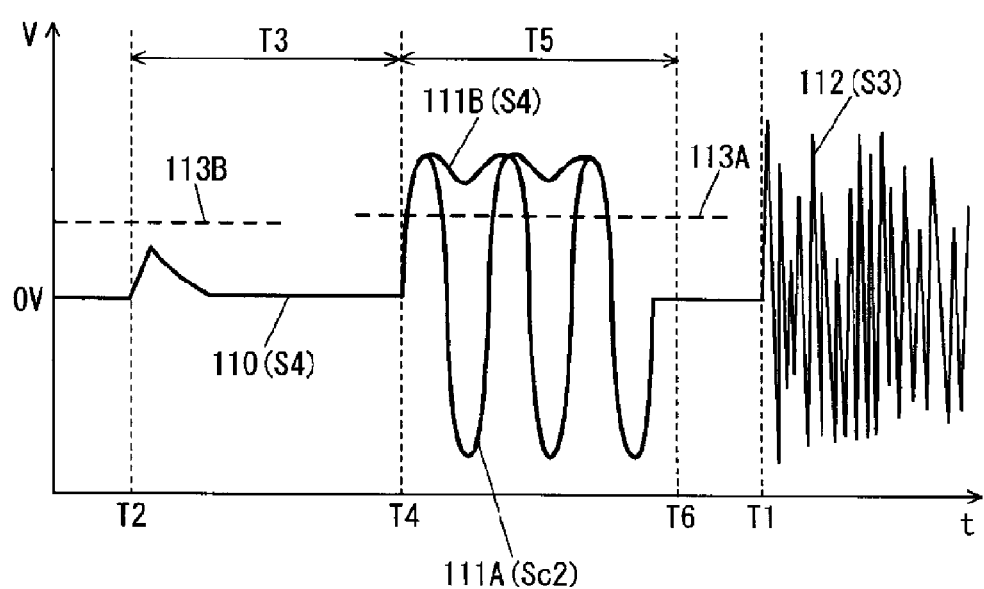
FIG. 3 is a voltage characteristic diagram of an operation of an acoustic device according to the exemplary embodiment of the present invention.

Next, configurations and operations of first detector 105 and determiner 107 are described with reference to FIG. 2 to FIG. 6. FIG. 3 is a voltage characteristic diagram of acoustic device 106 when acoustic system 201 normally operates. In FIG. 3, a horizontal axis represents time t, and a vertical axis represents voltage V.

The Configurations and the operations of first detector 105 and determiner 107 in the case where acoustic system 201 illustrated in FIG. 2 normally operates are described first. A voltage is applied to amplifier 102 at time T2 based on first reference signal X1. When amplifier 102 is turned on, capacitor 103 is charged with an offset voltage that is generated in an output of amplifier 102. In the case where first sound output unit 104 is electrically connected to acoustic device 106 in a normal state, first sound output unit 104 is a load. Therefore, even when amplifier 102 is turned on, a voltage of line 108 hardly rises because impedance of the speaker is low. As a result, first detector 105 outputs first detection signal S4 of voltage waveform 110 to determiner 107.

Determiner 107 compares first detection signal S4 with determination reference signal 113B. In this case, determiner 107 detects a maximum value of first detection signal S4, and may compare determination reference signal 113B with the maximum value. Alternatively, determiner 107 may compare first detection signal S4 with determination reference signal 113B every time when first detection signal S4 is obtained. In this case, in the case where all obtained first detection signals S4 are not more than determination reference signal 113B during the period of predetermined time T3, a determination can be made that a maximum voltage of first detection signal S4 is not more than determination reference signal 113B. Note that determination reference signal 113B is a threshold for diagnosing a state where acoustic device 106 short-circuits with respect to the power supply (+B) or is opened.

According to this configuration, during the period of time T3 from time T2, determiner 107 compares detected first detection signal S4 with determination reference signal 113B. When the maximum voltage of first detection signal S4 is not more than determination reference signal 113B, determiner 107 diagnoses that acoustic system 201 normally operates.

Second inspection signal Sc2 is preferably output at time T4 after the period of time T3 has passed from time T2 in order that first detector 105 properly detects a maximum value of voltage waveform 110. That is to say, if controller 101 outputs first inspection signal Sc1 before the period of time T3 has passed from time T2, determiner 107 occasionally cannot detect first detection signal S4 of voltage waveform 110 due to second inspection signal Sc2. Therefore, controller 101 preferably does not output any signal during the period of time T3 from time T2, and controller 101 preferably outputs first inspection signal Sc1 after the period of time T3 or longer passes from the input of first reference signal X1.

In this configuration, second inspection signal Sc2 of voltage waveform 111A is input into first detector 105 illustrated in FIG. 2. First detector 105 illustrated in FIG. 2 detects second inspection signal Sc2 and outputs first detection signal S4 of voltage waveform 111B to determiner 107. First detector 105 may include a wave detector. In this case, first detector 105 detects second inspection signal Sc2, and outputs DC first detection signal S4.

Then, determiner 107 compares first detection signal S4 with determination reference signal 113A. Determination reference signal 113A is a threshold that is used when acoustic device 106 diagnoses a malfunction caused by a short-circuit with respect to the ground. In this configuration, in the case where magnitude of first detection signal S4 is not less than a value of determination reference signal 113A, determiner 107 diagnoses that acoustic system 201 normally operates. The diagnosis in determiner 107 is completed at time T6 at which the period of time T5 has passed from time T4.

When controller 101 illustrated in FIG. 2 detects second reference signal X2, controller 101 outputs audio signal S1. As a result, amplifier 102 starts to output audio signal S3 of voltage waveform 112 at time T1. A difference between a timing when second reference signal X2 is input into controller 101 and a timing when first reference signal X1 is input into controller 101 is preferably longer than a sum of time T3 and time T5. That is to say, it is preferable that a time has passed from time T6 to time T1.

Further, controller 101 preferably generates audio signal S1 from sound source data after second reference signal X2 is input. In this configuration, time T1 can be further delayed by time required for a process for generating audio signal S1 from sound source data.

According to the above-mentioned configuration, controller 101 can output audio signal S1 after determiner 107 completes the diagnosis of a malfunction of acoustic system 201 illustrated in FIG. 2. As a result, determiner 107 can determine first detection signal S4 of voltage waveform 111B without being disturbed by audio signal S1. Therefore, determiner 107 can diagnose the malfunction of acoustic system 201.

Further, amplifier 102 is preferably turned off after time T6 so that operation of amplifier 102 is deactivated. In this configuration, power consumption of acoustic device 106 can be suppressed.

Figure 4:
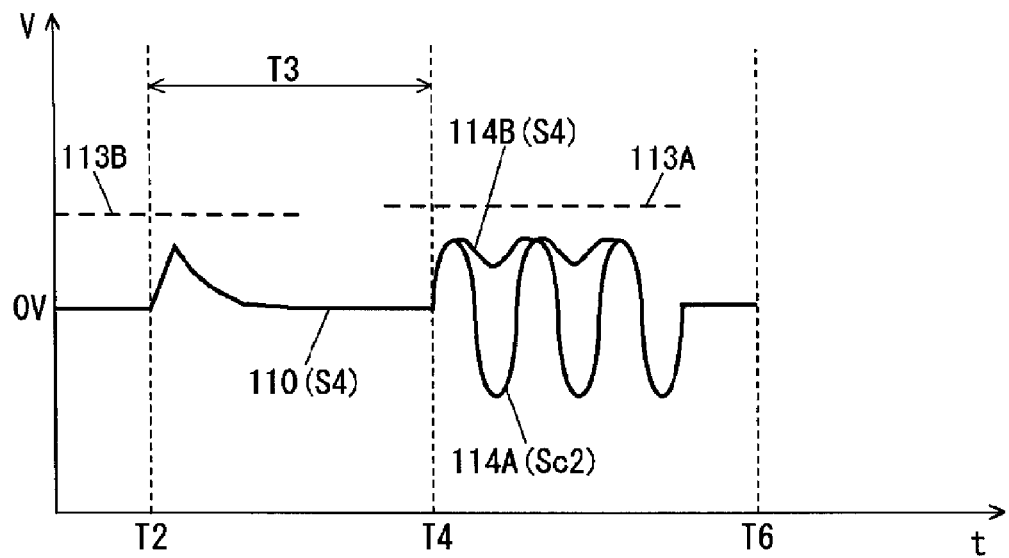
FIG. 4 is a voltage characteristic diagram of the acoustic device according to the exemplary embodiment of the present invention.
Figure 5:
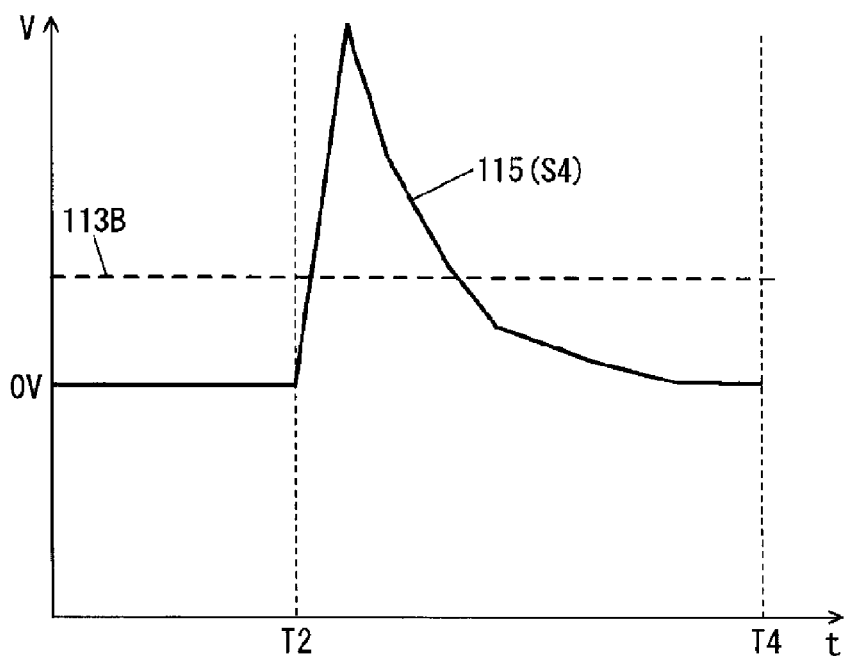
FIG. 5 is a voltage characteristic diagram of the acoustic device according to the exemplary embodiment of the present invention.
Figure 6:
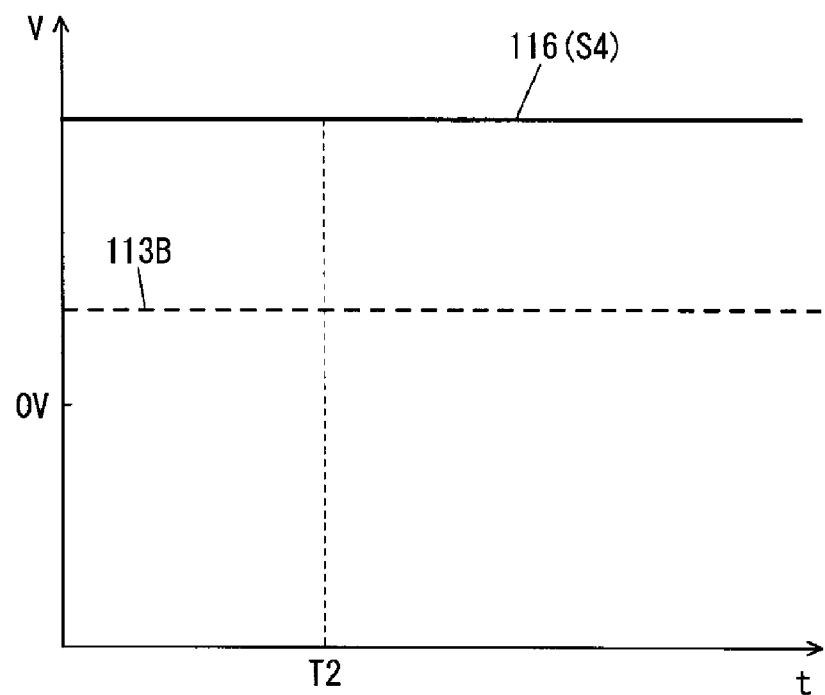
FIG. 6 is a voltage characteristic diagram of the acoustic device according to the exemplary embodiment of the present invention.

Hereinafter, a method in which acoustic device 106 determines that acoustic system 201 breaks down is described with reference to the drawings. FIG. 4 to FIG. 6 are voltage characteristic diagrams of acoustic device 106 in the case where acoustic system 201 breaks down. In FIG. 4 to FIG. 6, a horizontal axis represents time t, and a vertical axis represents voltage V. A method for diagnosing whether or not a short circuit occurs between acoustic device 106 and the ground is described first with reference to FIG. 4. For example, when a short circuit occurs between first connecting wire 104B and the ground, line 108 is electrically connected to the ground. Therefore, as illustrated in voltage waveform 114A of FIG. 4, a signal level of second inspection signal Sc2 is restrained. As a result, first detector 105 outputs first detection signal S4 of voltage waveform 114B to determiner 107.

Determiner 107 illustrated in FIG. 2 compares first detection signal S4 with determination reference signal 113A. When determining that the magnitude of first detection signal S4 is smaller than the magnitude of determination reference signal 113A, determiner 107 diagnoses that a short circuit occurs between the output side of amplifier 102 and the ground.

A method for diagnosing malfunctions when acoustic device 106 is in the open state and the short-circuit state between acoustic device 106 and the +B power supply is described below. The malfunction in the open state occurs when, for example, first sound output unit 104 is not connected to acoustic device 106. In this case, first sound output unit 104 does not become the load of acoustic device 106. Therefore, the maximum voltage of line 108 is higher than voltage waveform 110 illustrated in FIG. 3. As a result, first detector 105 outputs first detection signal S4 of voltage waveform 115 illustrated in FIG. 5 to determiner 107.

Determiner 107 compares first detection signal S4 with determination reference signal 113B. When determining that the maximum voltage of first detection signal S4 is higher than determination reference signal 113B, determiner 107 diagnoses that acoustic device 106 or acoustic system 201 breaks down in the open state.

On the other hand, the malfunction in the state of a short-circuit with respect to +B is caused by, for example, a short circuit between first connecting wire 104B and a line connected to the battery power supply of the vehicle. In this case, line 108 is connected to the line connected to the battery power supply of the vehicle with low resistance. Therefore, the voltage of line 108 is high.

The value of first detection signal S4 becomes upper limit voltage value 116 as illustrated in FIG. 6 at substantially the same time when amplifier 102 illustrated in FIG. 2 is turned on. In this case, first detection signal S4 is maintained at upper limit voltage value 116 thereafter. When determining that the maximum voltage of first detection signal S4 reaches upper limit voltage value 116, determiner 107 diagnoses that acoustic system 201 breaks down in the +B short-circuit state.

Further, determiner 107 preferably observes first detection signal S4 during the period of prescribed time. In this case, when detecting that the voltage of line 108 becomes approximately 0 V within the prescribed time, determiner 107 diagnoses that the malfunction in the open state occurs. On the other hand, when detecting that first detection signal S4 is maintained at upper limit voltage value 116 during the period of the prescribed time, determiner 107 diagnoses that the malfunction in the +B short-circuit state occurs.

According to the above configuration, acoustic device 106 can diagnose the malfunctions in the open state, the ground short-circuit state, the +B short-circuit state. Therefore, various malfunctions such that sound 202 is not output from first sound output unit 104 due to the malfunction of acoustic system 201 can be detected. As a result, quality and reliability of acoustic system 201 are improved. Further, an accident of collision between moving body device 301 and a person can be prevented. Further, since acoustic device 106 can be structured by a simple circuit, costs can be reduced.

Meanwhile, controller 101 may output a signal indicating presence/absence of output of first inspection signal Sc1. Controller 101 is not an essential component, and a configuration may be made such that first inspection signal Sc1 is input into amplifier 102. Preferably, determiner 107 receives the signal indicating presence/absence of first inspection signal Sc1. In this case, when detecting a signal indicating absence of output of first inspection signal Sc1, determiner 107 preferably compares first detection signal S4 of voltage waveform 110 or 115 with determination reference signal 113B. Preferably, when detecting a signal indicating output of first inspection signal Sc1, determiner 107 compares determination reference signal 113A with first detection signal S4 of voltage waveform 111B or 114B.

Figure 7:
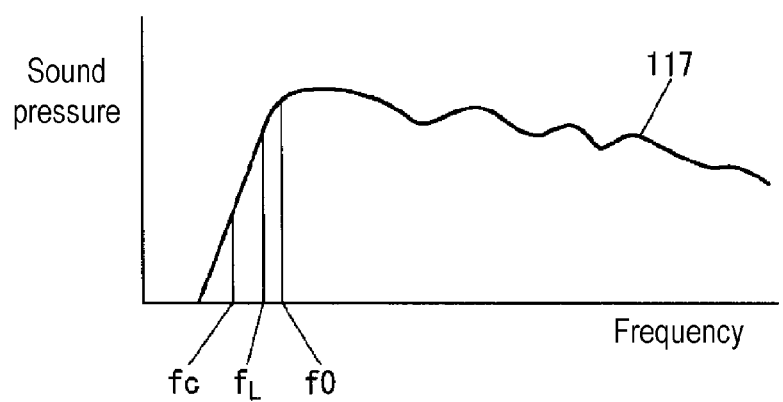
FIG. 7 is a sound pressure frequency characteristic diagram of a first speaker in the acoustic system according to the exemplary embodiment of the present invention.

FIG. 7 is a sound pressure frequency characteristic diagram of first speaker 104A according to the exemplary embodiment. In FIG. 7, a horizontal axis represents a frequency, and a vertical axis represents a value of a sound pressure level. Characteristic curve 117 represents a sound pressure frequency characteristic of first speaker 104A. A relationship between frequencies of first inspection signal Sc1 and second inspection signal Sc2 illustrated in FIG. 2 and the sound pressure frequency characteristic of first speaker 104A is described below with reference to the drawing. Sine waves can be used for first inspection signal Sc1 and second inspection signal Sc2. Preferably, the frequency of first inspection signal Sc1 is the approximately same as that of second inspection signal Sc2.

In general, in the sound pressure frequency characteristic of first speaker 104A, the sound pressure steeply attenuates in a low-frequency band. That is to say, in first speaker 104A, the sound pressure in a frequency lower than lowest resonance frequency f0 attenuates steeply. Therefore, frequency fc of second inspection signal Sc2 is preferably not more than lowest resonance frequency f0 of first speaker 104A.

For example, lowest resonance frequency f0 of first speaker 104A is preferably 500 Hz or more. In this case, frequency fc of second inspection signal Sc2 is preferably set to 20 Hz or more and 500 Hz or less. In the above setup, first speaker 104A does not have to reproduce a sound of low frequency. Therefore, first speaker 104A can narrow a reproduction frequency band. As a result, a cost of the first speaker is low.

More preferably, frequency fc of second inspection signal Sc2 is set to, for example, 20 Hz or more, and 100 Hz or less. In this setup, output of second inspection signal Sc2 from first speaker 104A can be further suppressed.

Further, frequency fc of second inspection signal Sc2 is preferably out of the reproduction frequency band of first speaker 104A. That is to say, frequency fc of second inspection signal Sc2 is preferably not more than a lower limit value of the reproduction frequency band of first speaker 104A (low band limit frequency $f_L$). The reproduction frequency band is compliant with International Standard IEC60268. Also in this case, first speaker 104A can greatly restrain second inspection signal Sc2. Therefore, output of second inspection signal Sc2 from first speaker 104A can be suppressed. In this case, low band limit frequency $f_L$ of first speaker 104A is preferably, for example, 250 Hz or higher.

Frequency fc of second inspection signal Sc2 may be less than 20 Hz. Preferably, second inspection signal Sc2 is an AC signal. Alternatively, frequency fc of second inspection signal Sc2 may be 20 kHz or more. An audible field of a person is generally 20 Hz to 20 kHz. Therefore, when frequency fc of second inspection signal Sc2 is set to a frequency out of the audible field of a person, second inspection signal Sc2 is not audible for a person. In the case where frequency fc of second inspection signal Sc2 is high, a processing time in determiner 107 becomes longer, and a power to be consumed also increases. Signal processing device 155 that supplies first inspection signal Sc1 to amplifier 102 is preferably formed of a digital signal processing circuit. A sampling frequency of the digital signal processing circuit is mostly set to 192 kHz. Therefore, frequency fc of second inspection signal Sc2 is preferably 96 kHz or less that is a Nyquist frequency of ½ of the sampling frequency. A high-frequency sound has excellent straightness. Further, attenuation of the high-frequency sound that is caused by propagation in air is large. Therefore, setup of frequency fc of second inspection signal Sc2 to 20 kHz or higher can suppress the sound in second inspection signal Sc2 from reaching person's ears.

According to the above configuration, in first speaker 104A, the sound pressure at frequency fc of second inspection signal Sc2 is lower than a sound pressure at a frequency of audio signal S2. That is to say, first speaker 104A outputs second inspection signal Sc2 such that second inspection signal Sc2 is restrained greatly in comparison with audio signal S2. As a result, output of second inspection signal Sc2 from first speaker 104A can be suppressed. Therefore, a passenger in moving body device 301 and/or a person around moving body device 301 cannot hear second inspection signal Sc2.

Preferably, a lower limit frequency of audio signal S3 is not less than a sound pressure frequency characteristic (low band limit frequency $f_L$) in a low-frequency band of first speaker 104A, or is not less than lowest resonance frequency f0. According to this setup, first speaker 104A can reproduce audio signal S3 faithfully.

Meanwhile, audio signal S3 may include a frequency of not more than the sound pressure frequency characteristic (low band limit frequency f1) in the low-frequency band of first speaker 104A, or may include a frequency of not more than lowest resonance frequency f0. Since audio signal S3 and second inspection signal Sc2 are not simultaneously output, audio signal S3 is not overlapped with second inspection signal Sc2.

Figure 8:
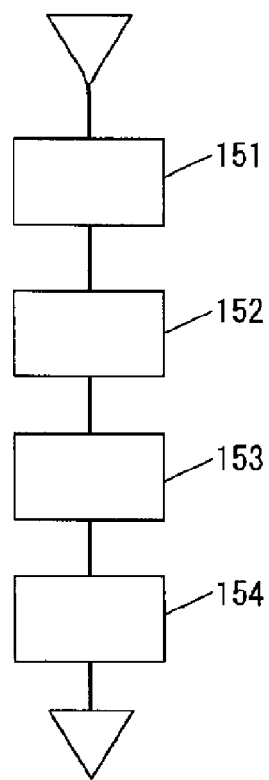
FIG. 8 is a control flowchart of the acoustic device according to the exemplary embodiment of the present invention.

FIG. 8 is a control flowchart of acoustic device 106. A malfunction diagnosis method for acoustic device 106 includes steps 151 to 154. In step 151, first inspection signal Sc1 or audio signal S1 is output according to input of a reference signal. In step 152, first inspection signal Sc1 or audio signal S1 is amplified. In step 153, first detection signal S4 is output based on amplified second inspection signal Sc2. In step 154, first detection signal S4 is compared with determination reference signal 113A or 113B.

In step 151, processes of controller 101 and inspection signal generator 109 are executed. In step 152, a process of amplifier 102 is executed. In step 153, a process of first detector 105 is executed. In step 154, a process of determiner 107 is executed. Preferably, controller 101 and determiner 107 are formed in signal processing device 155. In this case, step 151 and step 154 can be executed by software.

Figure 9:
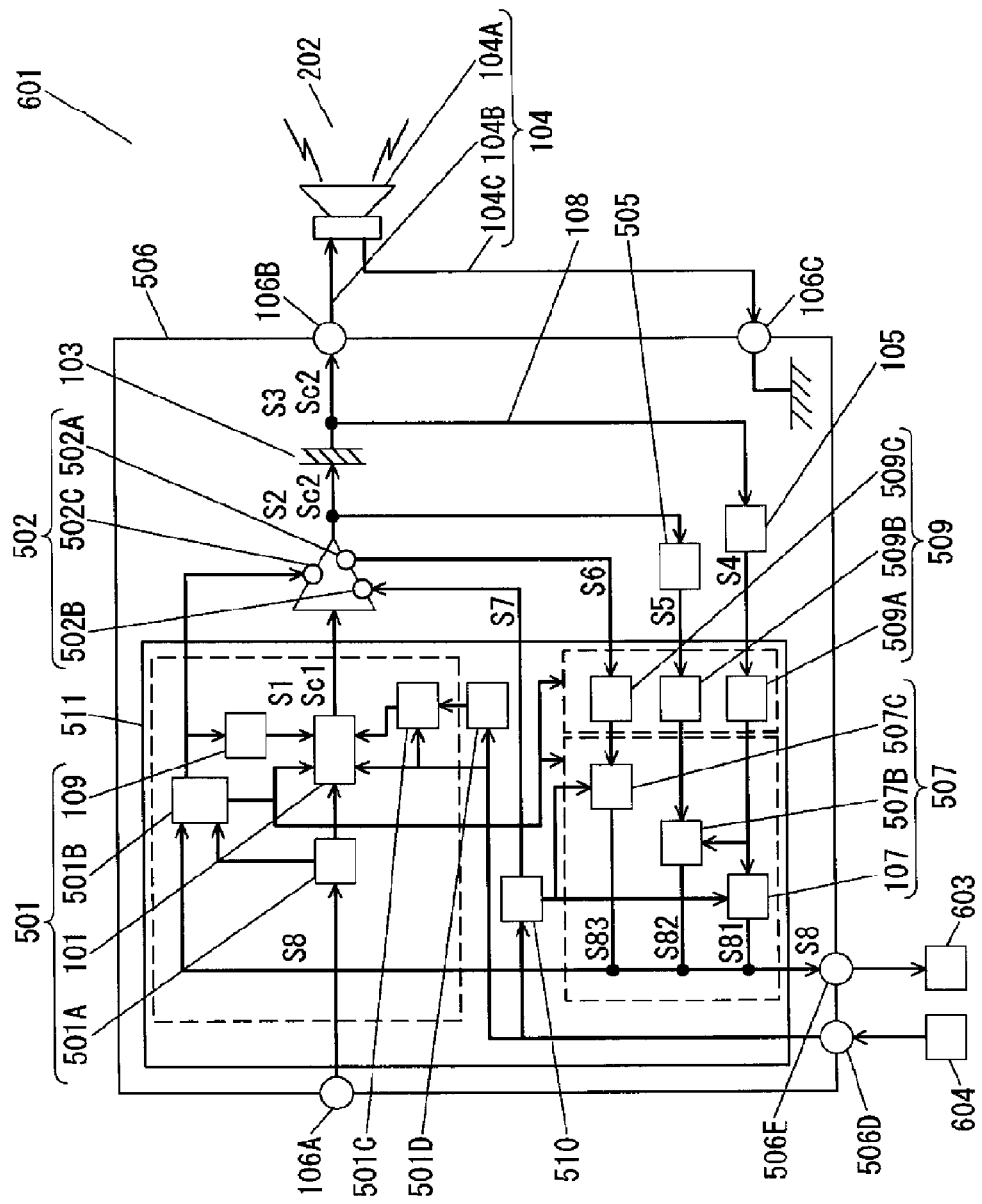
FIG. 9 is a block diagram of another acoustic system according to the exemplary embodiment of the present invention.

FIG. 9 is a block diagram of another acoustic system 601 according to the exemplary embodiment of the present invention. Acoustic system 601 includes acoustic device 506 instead of acoustic device 106 of acoustic system 201 illustrated in FIG. 2. Further, acoustic system 601 preferably includes notifier 603 and input device 604.

Acoustic device 506 includes input terminal 106A, output terminal 106B, ground terminal 106C, input unit 506D, alarm terminal 506E, signal generator 501, amplifier 502, capacitor 103, first detector 105, second detector 505, AD converter 509, and determiner 507. Further, AD converter 509 includes AD converters 509A, 509B, and 509C.

Amplifier 502 includes monitor terminal 502A, gain control terminal 502B, and power supply terminal 502C. Monitor terminal 502A outputs voltage value S6 that is proportional to an electric current flowing in amplifier 502. Amplification gain of amplifier 502 changes according to control signal S7 to be input into gain control terminal 502B.

Determiner 507 includes determiner 107, second determiner 507B, and third determiner 507C.

Signal generator 501 includes detector 501A, power supply controller 501B, inspection signal generator 109, and controller 101. Preferably, signal generator 501 further includes selector 501C and storage 501D. The reference signal supplied to input terminal 106A is input into detector 501A. An output side of detector 501A is electrically connected to controller 101 and power supply controller 501B. Detector 501A determines whether the input reference signal is second reference signal X2 or first reference signal X1. When detector 501A determines that the input reference signal is second reference signal X2, detector 501A outputs a signal to controller 101 and power supply controller 501B. The signal indicates that second reference signal X2 is received. On the other hand, when detector 501A determines that the input reference signal is first reference signal X1, detector 501A outputs a signal to controller 101 and power supply controller 501B. The signal indicates that first reference signal X1 is received.

Preferably, an output side of power supply controller 501B is connected to power supply terminal 502C of amplifier 502. The output side of controller 101 is electrically connected to amplifier 502. In this configuration, when second reference signal X2 is input, power supply controller 501B turns on amplifier 502. An output signal from amplifier 502 is supplied to output terminal 106B and first detector 105 via capacitor 103. Preferably, the output side of power supply controller 501B is connected to an input side of controller 101. Further, the output side of power supply controller 501B is preferably connected to determiner 507 and AD converter 509. In this configuration, when second reference signal X2 is input, power supply controller 501B turns on controller 101, determiner 507, and AD converter 509. Controller 101, determiner 507, and AD converter 509 may be turned on in cooperation with the power supply of acoustic device 506.

Inspection signal generator 109 may store first inspection signal Sc1. In this configuration, when second reference signal X2 is input, controller 101 reads first inspection signal Sc1 from inspection signal generator 109. In this case, inspection signal generator 109 may store first inspection signal Sc1 as data converted into a digital signal. Controller 101 converts data of first inspection signal Sc1 into first inspection signal Sc1 that is an analog signal. Inspection signal generator 109 may generate first inspection signal Sc1. In this case, when second reference signal X2 is input, power supply controller 501B preferably turns on also controller 101 and inspection signal generator 109. In this case, when being powered on, inspection signal generator 109 can generate first inspection signal Sc1 and output first inspection signal Sc1 to controller 101. Alternatively, the output side of detector 501A may be electrically connected to inspection signal generator 109. In this case, when detector 501A detects first reference signal X1, inspection signal generator 109 can output first inspection signal Sc1 to controller 101.

According to the above configuration, when second reference signal X2 is input, controller 101 outputs first inspection signal Sc1 generated by inspection signal generator 109 to amplifier 502.

Preferably, inspection signal generator 109 stops generating first inspection signal Sc1 at time T6 illustrated in FIG. 3. For example, when, power supply controller 501B turns off inspection signal generator 109 at time T6, so that the generation of first inspection signal Sc1 is shut off. As a result, power consumption of acoustic device 506 can be restrained. Preferably, power supply controller 501B turns off also amplifier 502 and controller 101 at time T6. Further preferably, power supply controller 501B turns off also determiner 507 and AD converter 509C at time T6. According to this configuration, the power consumption of acoustic device 506 can be further restrained.

In the case where amplifier 502 and controller 101 are turned off at time T6, when reference signal X1 is input, power supply controller 501B again turns on controller 101 and amplifier 502. When first reference signal X1 is input, controller 101 outputs audio signal S1 to amplifier 502. As a result, first speaker 104A converts audio signal S2 into sound 202 and outputs sound 202. For example, in the case where second reference signal X2 indicates start of movement of moving body device 301 illustrated in FIG. 1, acoustic system 601 starts to output sound 202 at substantially the same time when moving body device 301 starts to move.

The diagnosis of a malfunction of acoustic system 601 is completed until time T6. That is to say, blocks necessary only for the diagnosis of a malfunction of acoustic system 601 do not have to be in an operating status after time T6. Determiner 507 and AD converter 509C are the blocks necessary only for the diagnosis of a malfunction of acoustic system 601. Therefore, the power of determiner 507 and the AD converter 509C may be maintained at the off state even after time T6. In this configuration, the power consumption of acoustic device 506 can be further restrained.

Meanwhile, determiner 507 and AD converter 509C may be turned on at time T6. In this configuration, a malfunction of acoustic system 601 can be diagnosed ongoingly even after time T6. For example, when second reference signal X2 indicates start of the movement of moving body device 301 illustrated in FIG. 1, a malfunction that is caused in acoustic system 601 during the movement of moving body device 301 can be also diagnosed. In this case, first detector 105 detects voltage waveform 112 of audio signal S3 illustrated in FIG. 3 so as to output the same to determiner 107. Determiner 107 compares a value of detected audio signal S3 with determination reference signal 113A.

Input unit 506D is connected to an input side of controller 101. Input unit 506D receives sound source data to be used by controller 101 to generate audio signal S1 from the outside. Input device 604 is connected to input unit 506D. Input device 604 may include a device that reads sound source data from a storage medium. Input device 604 may further include a storage medium in which sound source data is stored. Examples of the storage medium include an SD memory card, a CD, a DVD, and an USB memory. Further, the storage medium may be a device that can store sound source data. Examples of the storage medium may include a music reproducing device such as an MP3 player, a smartphone, a tablet terminal, and a personal computer.

Preferably, sound source data stored in the storage medium is captured into storage 501D. In this case, after sound source data is captured into storage 501D, connection between the storage medium and acoustic system 601 can be released. Naturally, controller 101 may use sound source data stored in the storage medium.

In this configuration, acoustic system 601 can receive sound source data from the outside. Therefore, sound 202 can be freely changed.

Further, preferably, input unit 506D is electrically connected to selector 501C. Selector 501C selects one sound source data from a plurality of the sound source data based on a selection signal input from input device 604 and outputs the selected data to controller 101. Preferably, input device 604 includes an input instrument such as a touch panel and an input switch in order to output the selection signal. The plurality of the sound source data is preferably stored in storage 501D or the storage medium included in input device 604.

In this configuration, selector 501C selects one sound source data from a plurality of the sound source data stored in storage 501D or input device 604 according to the selection signal. Therefore, acoustic system 601 can easily change sound 202.

In such a manner, a signal level of audio signal S3 generated from sound source data captured from the outside varies according to the original sound source data. Therefore, in the case where acoustic device 506 diagnoses a malfunction of acoustic system 601 using audio signal S3, the signal level of the sound source data captured from the outside is unknown, and thus acoustic device 506 cannot diagnose a malfunction of acoustic system 601.

Therefore, acoustic device 506 diagnoses a malfunction of acoustic system 601 according to first inspection signal Sc1 generated by inspection signal generator 109. That is to say, acoustic device 506 diagnoses a malfunction of acoustic system 601 without using audio signal S3. Further, the signal level of first inspection signal Sc1 is known. Therefore, acoustic device 506 can diagnose a malfunction of acoustic system 601 regardless of the selected audio signal.

The output side of first detector 105 is electrically connected to determiner 107 and second determiner 507B via AD converter 509A. Wiring between capacitor 103 and amplifier 502 is electrically connected to an input terminal of second detector 505. An output side of second detector 505 is electrically connected to second determiner 507B via AD converter 509B. In this configuration, second detector 505 can detect magnitude of audio signal S2. That is to say, second detector 505 can detect a voltage to be input into capacitor 103. Second detector 505 outputs second detection signal S5 according to a level of audio signal S2. Second determiner 507B compares first detection signal S4 with second detection signal S5. In the above configuration, when second determiner 507B determines that magnitude of first detection signal S4 is equal to magnitude of second detection signal S5, second determiner 507B diagnoses that capacitor 103 is short-circuited.

Monitor terminal 502A is electrically connected to an input side of third determiner 507C via AD converter 509C. Third determiner 507C compares voltage value S6 output from monitor terminal 502A with a predetermined threshold. When the voltage value output from monitor terminal 502A is determined to be larger than the threshold, third determiner 507C diagnoses that an overcurrent flows in amplifier 502.

Output sides of determiner 107, second determiner 507B, and third determiner 507C are electrically connected to power supply controller 501B and alarm terminal 506E. Notifier 603 is electrically connected to alarm terminal 506E.

In the above configuration, determiner 107, second determiner 507B, and third determiner 507C output determined results therein to power supply controller 501B and notifier 603. When determiner 107, second determiner 507B, and third determiner 507C diagnose that acoustic system 601 breaks down, they output signal S8 indicating that acoustic system 601 breaks down. Signal S8 preferably includes signal S81 to be output from determiner 107, signal S82 to be output from second determiner 507B, and signal S83 to be output from third determiner 507C. Signal S81 is used for determining a malfunction in the open state, a malfunction in the ground short-circuit, or a malfunction in the +B short-circuit as described with reference to FIG. 4 to FIG. 6.

When power supply controller 501B receives signal S8 indicating that a malfunction occurs, power supply controller 501B preferably shut off the power supply to amplifier 502. Further, more preferably, when power supply controller 501B is connected to controller 101, acoustic device 506 shuts off output of audio signal S1 from controller 101. For this reason, acoustic device 506 may shut off the power supply to controller 101.

Therefore, when acoustic system 601 breaks down because an overcurrent flows in amplifier 502, the overcurrent can be prevented from continuously flowing in amplifier 502. When acoustic system 601 breaks down due to the short-circuit of capacitor 103, a DC component included in audio signal S2 can be prevented from being supplied to first speaker 104A. Therefore, a malfunction of first speaker 104A can be prevented.

On the other hand, when notifier 603 receives signal S8 indicating that the malfunction occurs, notifier 603 notifies the operator of a diagnosed result in determiner 507. Since notifier 603 can determine a malfunctioned place based on signals S81, S82, and S83, notifier 603 can provide a notification according to malfunction contents.

A second speaker may be used as notifier 603. That is to say, acoustic system 601 may further include the second speaker besides first speaker 104A. In this case, the second speaker is disposed in main body 302 so as to be capable of outputting an alarm sound to space 307 illustrated in FIG. 1.

In this configuration, the second speaker can notify the operator of a malfunction using the sound. Therefore, operator's visibility is not necessary. As a result, the operator can recognize a malfunction in any direction of operator's visual field.

Alternatively, notifier 603 may be an indicator that displays a malfunction through emission of light. In this configuration, even when the operator is listening to music, the operator can recognize a malfunction of acoustic system 601. Further, notifier 603 may include both the second speaker and the indicator. In this configuration, the operator recognizes a malfunction of acoustic system 601 more easily.

First speaker 104A is disposed in a motor room provided in front part of moving body device 301 illustrated in FIG. 1. However, in moving body devices 301 whose type varies, places where first speakers 104A can be disposed occasionally vary. For example, when first speaker 104A is disposed separately from a front end of moving body device 301, sound 202 to be heard by the person is reduced.

Therefore, setting unit 510 is preferably provided to acoustic device 506. Input device 604 is electrically connected to input unit 506D. Input unit 506D is electrically connected to an input side of setting unit 510. An output side of setting unit 510 is electrically connected to input sides of gain control terminal 502B, determiner 107, and third determiner 507C.

In the above configuration, setting unit 510 controls an amplification degree of amplifier 502 according to a set value input into input device 604. Setting unit 510 outputs determination reference signals 113A and 113B to determiner 107. Signals 113A and 113B are associated with the amplification degree of amplifier 502. Further, setting unit 510 outputs a threshold of third determiner 507C to third determiner 507C. The threshold is associated with the amplification degree of amplifier 502. Therefore, even when the vehicle type and the places where first speaker 104A is disposed vary, sound 202 to be output to the outside of the vehicle can be set to predetermined loudness.

Further, since a frequency of first inspection signal Sc1 is low, clocks for operating AD converters 509A, 509B, and 509C can be slow. Therefore, the power consumption of acoustic device 506 can be also reduced.

Preferably, acoustic device 506 is further provided with a circuit that controls an electric current flowing in amplifier 502. In this configuration, an overcurrent can be suppressed from flowing in amplifier 502. Therefore, breakage of amplifier 502 can be prevented.

The malfunction diagnosis method for acoustic device 506 includes step 151, step 152, step 153, and step 154 illustrated in FIG. 8.

In step 151, processes of detector 501A, power supply controller 501B, and inspection signal generator 109 as well as controller 101 are executed. In step 151, preferably, processes of setting unit 510, input unit 506D, and selector 501C are further executed. Further, in step 151, a process of input device 604 may be executed.

In step 152, a process of amplifier 502 is executed. In step 153, in addition to the process of first detector 105, a process of second detector 505 is executed. In step 154, in addition to the process of determiner 107, processes of second determiner 507B, third determiner 507C, AD converters 509A, 509B, and 509C are executed. In step 154, a process of notifier 603 may be executed.

Signal generator 501, determiner 507, and setting unit 510 are preferably formed in signal processing device 511. In this case, signal generator 501, determiner 507, and setting unit 510 can be formed by software.

Further, in the malfunction diagnosis method for acoustic device 506, the process of setting unit 510 may be executed in step 151.

Figure 10:
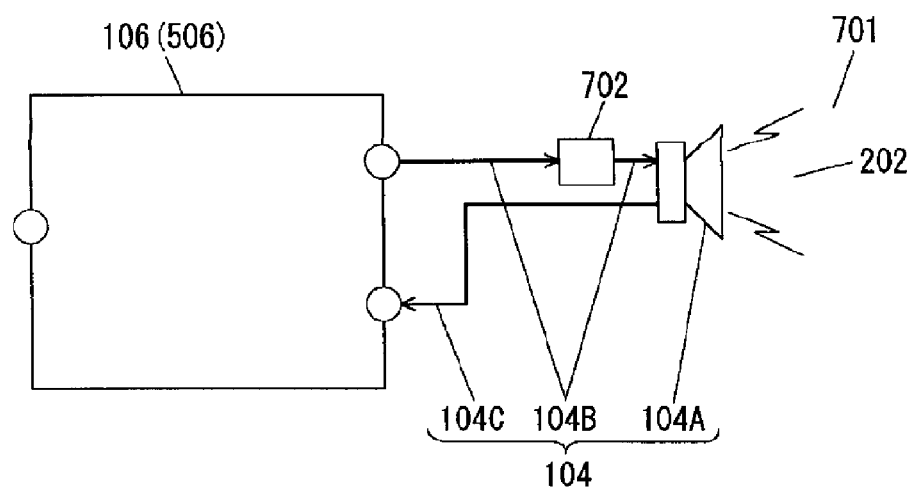
FIG. 10 is a block diagram of still another acoustic system according to the exemplary embodiment of the present invention.

FIG. 10 is a block diagram of still another acoustic system according to the exemplary embodiment. Acoustic system 701 includes filter 702 that blocks signals in the frequency band of second inspection signal Sc2, in comparison with acoustic system 201 or 601. Preferably, filter 702 is inserted into a part (path) of first connecting wire 104B or second connecting wire 104C. A notch filter can be used as filter 702. Filter 702 is not limited to the notch filter, and a highpass filter or a bandpass filter can be used.

According to this configuration, second inspection signal Sc2 may be suppressed from being supplied to first speaker 104A. Therefore, the sound of second inspection signal Sc2 can be restrained from being output from first speaker 104A. In this case, filter 702 is preferably disposed near first speaker 104A.

Figure 11:
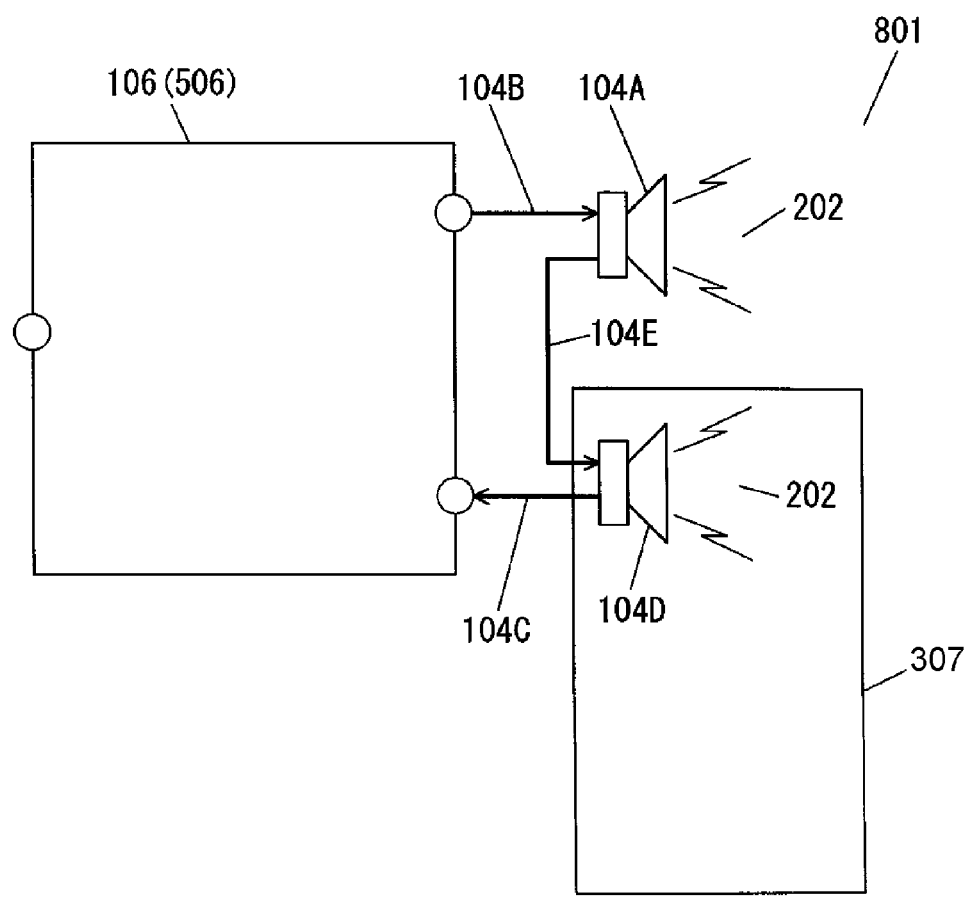
FIG. 11 is a block diagram of an acoustic system when a plurality of speakers is connected in the exemplary embodiment of the present invention.

FIG. 11 is a block diagram of the acoustic system when a plurality of speakers is connected in the exemplary embodiment. Acoustic system 801 further includes third speaker 104D in comparison with acoustic system 201 or 601. Third speaker 104D is connected to first speaker 104A in series. First speaker 104A and third speaker 104D are connected by third connecting wire 104E. First speaker 104A is housed in main body 302 so as to be capable of outputting sound 202 to the outside of moving body device 301 illustrated in FIG. 1. On the other hand, third speaker 104D is mounted to main body 302 so as to be capable of outputting sound 202 into space 307. In the above configuration, acoustic system 801 can output sound 202 to both the inside and outside of moving body device 301 illustrated in FIG. 1.

Figure 12:
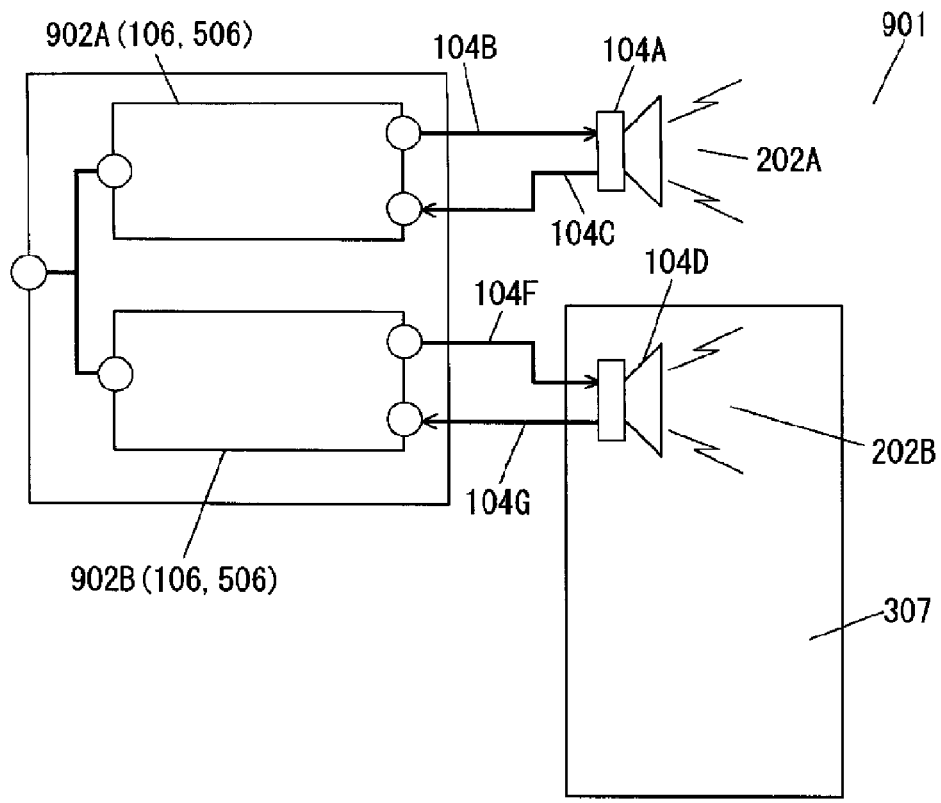
FIG. 12 is a block diagram of another acoustic system when the plurality of speakers is connected in the exemplary embodiment of the present invention.

FIG. 12 is a block diagram of another acoustic system when a plurality of speakers is connected in the exemplary embodiment. Acoustic system 901 includes first acoustic device 902A and second acoustic device 902B. First speaker 104A is connected to first acoustic device 902A by first connecting wire 104B and second connecting wire 104C. On the other hand, third speaker 104D is connected to second acoustic device 902B by fourth connecting wire 104F and fifth connecting wire 104G.

Any one of acoustic devices 106 and 506 may be used as first acoustic device 902A. Further, any one of acoustic devices 106 and 506 may be used as second acoustic device 902B. In this configuration, sound 202A to be output from first speaker 104A can be different from sound 202B to be output from third speaker 104D.

In this case, however, first acoustic device 902A and second acoustic device 902B preferably share input terminal 106A, detector 501A, inspection signal generator 109, and notifier 603. Further, when both first acoustic device 902A and second acoustic device 902B have the same configuration as acoustic device 506, first acoustic device 902A and second acoustic device 902B can also share input unit 506D, input device 604, and the like.

INDUSTRIAL APPLICABILITY

The acoustic device of the present invention is useful when it is mounted to electric vehicles and hybrid vehicles that run by motors.

The invention claimed is:

1. An acoustic device comprising:
an inspection signal generator that outputs a first inspection signal;
an amplifier that receives the first inspection signal and outputs a second inspection signal according to the first inspection signal;
an output terminal electrically connected to an output side of the amplifier;
a ground terminal electrically connected to a ground;
a first detector that is electrically connected to the output side of the amplifier and outputs a first detection signal based on the second inspection signal; and
a determiner that:
compares a voltage amplitude of the first detection signal output from the first detector with a voltage amplitude of a preset first determination reference signal so as to determine a short-circuit state of the output terminal to the ground, and
compares the voltage amplitude of the first detection signal with a voltage amplitude of a preset second determination reference signal different from the first determination reference signal so as to determine that the output terminal is open when the maximum value of the voltage amplitude of the first detection signal is larger than the second determination reference signal, and that the output terminal is short-circuited to a power supply when the voltage amplitude of the first detection signal is equal to a maximum voltage that is a voltage of the power supply.

2. The acoustic device according to claim 1, further comprising:
an input terminal that receives a first reference signal from an outside; and
a controller that receives the first reference signal from the input terminal, receives the first inspection signal from the inspection signal generator, and outputs any one of an audio signal and the first inspection signal according to the first reference signal,
wherein the amplifier is electrically connected to an output side of the controller and amplifies the audio signal.

3. The acoustic device according to claim 2, further comprising an input unit that is connected to an input side of the controller and receives, from the outside, sound source data for the controller to generate the audio signal.

4. The acoustic device according to claim 2, further comprising:
a selector that selects one sound source data from a plurality of the sound source data for the controller to generate the audio signal based on one sound source data; and
an input unit that is electrically connected to the selector or the controller and receives at least one of the plurality of sound source data from the outside.

5. The acoustic device according to claim 2, further comprising:
a detector connected to an input side of the controller; and
a power supply controller connected to the amplifier and an output side of the detector.

6. The acoustic device according to claim 5, wherein the power supply controller is connected to an output side of the determiner.

7. The acoustic device according to claim 1, wherein the second inspection signal has a frequency lower than a frequency of the audio signal.

8. The acoustic device according to claim 1, wherein the second inspection signal is an alternating signal, and a frequency of the second inspection signal is less than 20 Hz or 20 kHz or more.

9. The acoustic device according to claim 1, further comprising:
a capacitor connected between the amplifier and the output terminal in series; and
a second detector that has an input terminal connected between the capacitor and the amplifier and outputs a second detection signal to the determiner based on an output signal from the amplifier,
wherein an input terminal of the first detector is connected to a portion between the capacitor and the output terminal,
the determiner compares a voltage amplitude of the second detection signal output from the second detector with the voltage amplitude of the first detection signal.

10. The acoustic device according to claim 1, wherein
the amplifier has a monitor terminal that outputs a voltage value proportional to an electric current flowing in the amplifier, and the monitor terminal is connected to an input side of the determiner, and
the determiner compares the voltage value with a preset threshold.

11. The acoustic device according to claim 1, further comprising:
an input unit that receives setting of an amplification degree of the amplifier; and
a setting unit that is electrically connected to the determiner and the amplifier, sets the amplification degree of the amplifier based on the setting received by the input unit, and changes a value of the determination reference signal into a value according to the amplification degree.

12. The acoustic device according to claim 10, wherein when the voltage value is larger than the threshold, the determiner determines that an overcurrent flows in the amplifier.

13. An acoustic system comprising:
the acoustic device as defined in claim 1; and
a first speaker electrically connected between the output terminal and the ground terminal of the acoustic device.

14. The acoustic system according to claim 13, wherein a sound pressure frequency characteristic of the first speaker shows that a sound pressure at a frequency of the second inspection signal is smaller than a sound pressure at a frequency of the audio signal.

15. A moving body device comprising:
a main body part including a space therein;
a driver mounted to the main body part;
the acoustic system as defined in claim 13, which is mounted to the main body part and emits a sound into the space; and
a drive controller that generates the first reference signal.

16. The moving body device according to claim 15, wherein
the drive controller generates a second reference signal indicating that movement of the moving body device is started, and
the acoustic device included in the acoustic system receives the first reference signal and the second reference signal, restrains output from the first speaker and simultaneously diagnoses a malfunction of the acoustic system when the first reference signal is input, and outputs an audio signal when the second reference signal is input.

17. A malfunction diagnosis method for an acoustic system,
the acoustic system including:
an acoustic device that has an amplifier into which an audio signal is input and outputs the audio signal amplified by the amplifier; and
a speaker that emits a sound of the audio signal to be output from the acoustic device,
the method comprising:
generating a first inspection signal;
outputting the first inspection signal or the audio signal according to an input first reference signal;
amplifying the first inspection signal or the audio signal;
outputting a first detection signal based on a second inspection signal obtained by amplifying the first inspection signal;
comparing a voltage amplitude of the first detection signal with a voltage amplitude of a preset first determination reference signal so as to determine a short-circuit between an output terminal electrically connected to an output side of the amplifier and a ground terminal electrically connected to a ground;
comparing the voltage amplitude of the first detection signal with a voltage amplitude of a preset second determination reference signal which is different from the first determination reference signal; and
determining that the output terminal is open when the maximum value of the voltage amplitude of the first detection signal is larger than the voltage amplitude of the second determination reference signal, and that the output terminal is short-circuited to a power supply when the voltage amplitude of the first detection signal is equal to a maximum voltage that is a voltage of the power supply.

18. The malfunction diagnosis method for the acoustic system according to claim 17, wherein the first inspection signal is generated so that a frequency of the second inspection signal is lower than a frequency of the audio signal.

19. The malfunction diagnosis method for the acoustic system according to claim 18, wherein the second inspection signal is an alternating signal, and the first inspection signal is generated so that the frequency of the second inspection signal is less than 20 Hz or 20 kHz or more.

20. The malfunction diagnosis method for the acoustic system according to claim 17, further comprising receiving sound source data from an outside,
wherein the audio signal is output based on the sound source data.

21. The malfunction diagnosis method for the acoustic system according to claim 17, further comprising:
receiving a selection signal from an outside; and
selecting one sound source data from a plurality of the sound source data based on the selection signal,
wherein the audio signal is generated and output based on the selected one sound source data.

22. The malfunction diagnosis method for the acoustic system according to claim 17, further comprising:
detecting a voltage value proportional to an electric current flowing in the amplifier when the audio signal is amplified; and
comparing the voltage value with a preset threshold.

23. The malfunction diagnosis method for the acoustic system according to claim 22, wherein when the voltage value is larger than the threshold, a determination is made that an overcurrent flows when the audio signal is amplified.

24. The malfunction diagnosis method for the acoustic system according to claim 17, further comprising:
detecting the first reference signal;
operating the amplifier based on a result of detecting the first reference signal; and
stopping the operation of the amplifier after comparing the voltage amplitude of the first detection signal with the voltage amplitude of the first determination reference signal.

* * * * *